(12) United States Patent
Neel et al.

(10) Patent No.: US 10,139,439 B2
(45) Date of Patent: Nov. 27, 2018

(54) METHOD OF CAPACITIVE MEASUREMENT BETWEEN AN OBJECT AND AN ELECTRODE PLANE BY PARTIAL SYNCHRONOUS DEMODULATION

(71) Applicant: QUICKSTEP TECHNOLOGIES LLC, Wilmington, DE (US)

(72) Inventors: Christian Neel, Nimes (FR); Christophe Blondin, Nimes (FR)

(73) Assignee: Quickstep Technologies LLC, Wilmington, DE (US)

( * ) Notice: Subject to any disclaimer, the term of this patent is extended or adjusted under 35 U.S.C. 154(b) by 0 days.

(21) Appl. No.: 14/384,797

(22) PCT Filed: Mar. 8, 2013

(86) PCT No.: PCT/EP2013/054730
§ 371 (c)(1),
(2) Date: Sep. 12, 2014

(87) PCT Pub. No.: WO2013/135576
PCT Pub. Date: Sep. 19, 2013

(65) Prior Publication Data
US 2015/0048850 A1 Feb. 19, 2015

(30) Foreign Application Priority Data

Mar. 13, 2012 (FR) ...................................... 12 52272

(51) Int. Cl.
*G01R 27/26* (2006.01)
*G06F 3/041* (2006.01)
*G06F 3/044* (2006.01)

(52) U.S. Cl.
CPC ......... *G01R 27/2605* (2013.01); *G06F 3/044* (2013.01); *G06F 3/0418* (2013.01)

(58) Field of Classification Search
None
See application file for complete search history.

(56) References Cited

U.S. PATENT DOCUMENTS

| 3,761,805 A | 9/1973 | Dornberger |
| 4,634,964 A | 1/1987 | Chattler |
| (Continued) | | |

FOREIGN PATENT DOCUMENTS

| EP | 0 589 498 | 3/1994 |
| EP | 2 267 791 A2 | 10/2010 |
| (Continued) | | |

OTHER PUBLICATIONS

E. Franchi Scarselli, A. Gnudi, F. Natali, M. Scandiuzzo, R. Canegallo and R. Guerrieri, "Automatic Compensation of the Voltage Attenuation in 3-D Interconnection Based on Capacitive Coupling," in IEEE Journal of Solid-State Circuits, vol. 46, No. 2, pp. 498-506, Feb. 2011.*

(Continued)

*Primary Examiner* — Vincent Q Nguyen
(74) *Attorney, Agent, or Firm* — Morrison & Foerster LLP

(57) ABSTRACT

A method of capacitive measurement between an object and an electrode plane includes applying an excitation signal to the resistive electrode plane, and determining a value of capacitance on the basis of a measurement of a measurement signal originating from the electrode plane. The excitation signal is a nonsinusoidal signal having at least one discontinuity. To determine the value of capacitance, the measurement signal is attenuated over a time window, this time window being the duration for which the resistivity of the electrode plane is manifested on the measurement signal in response to the at least one discontinuity.

17 Claims, 4 Drawing Sheets

(56) References Cited

U.S. PATENT DOCUMENTS

| | | |
|---|---|---|
| 5,483,261 A | 1/1996 | Yasutake |
| 5,488,204 A | 1/1996 | Mead et al. |
| 5,572,205 A * | 11/1996 | Caldwell ............ H03K 17/9622 |
| | | 361/181 |
| 5,651,044 A | 7/1997 | Klotz, Jr. et al. |
| 5,825,352 A | 10/1998 | Bisset et al. |
| 5,835,079 A | 11/1998 | Shieh |
| 5,844,506 A | 12/1998 | Binstead |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 6,847,354 B2 | 1/2005 | Vranish |
| 7,015,894 B2 | 3/2006 | Morohoshi |
| 7,184,064 B2 | 2/2007 | Zimmerman et al. |
| 7,570,064 B2 | 8/2009 | Roziere |
| 7,663,607 B2 | 2/2010 | Hotelling et al. |
| 8,148,002 B2 | 4/2012 | Nagai et al. |
| 8,149,002 B2 | 4/2012 | Ossart et al. |
| 8,159,213 B2 | 4/2012 | Roziere |
| 8,479,122 B2 | 7/2013 | Hotelling et al. |
| 8,770,033 B2 | 7/2014 | Roziere |
| 8,917,256 B2 | 12/2014 | Roziere |
| 9,035,903 B2 | 5/2015 | Binstead |
| 2002/0196036 A1* | 12/2002 | Toyoshima .......... G06K 9/0002 |
| | | 324/702 |
| 2006/0097733 A1 | 5/2006 | Roziere |
| 2006/0197753 A1 | 9/2006 | Hotelling |
| 2008/0157893 A1* | 7/2008 | Krah .................. G06F 3/0418 |
| | | 331/177 R |
| 2008/0284261 A1 | 11/2008 | Andrieux et al. |
| 2009/0243628 A1* | 10/2009 | Andarawis ............ H03D 13/00 |
| | | 324/601 |
| 2010/0052700 A1 | 3/2010 | Yano et al. |
| 2010/0292945 A1* | 11/2010 | Reynolds ............... G06F 3/044 |
| | | 702/65 |
| 2011/0007030 A1* | 1/2011 | Mo ........................ G06F 3/044 |
| | | 345/174 |
| 2011/0163992 A1 | 7/2011 | Cordeiro et al. |
| 2011/0169783 A1 | 7/2011 | Wang et al. |
| 2012/0001662 A1* | 1/2012 | Pidutti .................... H02M 1/32 |
| | | 327/108 |
| 2012/0044662 A1 | 2/2012 | Kim et al. |
| 2012/0050217 A1* | 3/2012 | Noguchi ............... G06F 3/0412 |
| | | 345/174 |
| 2012/0092350 A1* | 4/2012 | Ganapathi .......... G02B 26/0833 |
| | | 345/501 |
| 2012/0187965 A1 | 7/2012 | Roziere |
| 2012/0188200 A1 | 7/2012 | Roziere |
| 2012/0274582 A1* | 11/2012 | Shih ........................ G06F 3/044 |
| | | 345/173 |
| 2013/0106722 A1* | 5/2013 | Shahparnia .......... G06F 3/03545 |
| | | 345/173 |
| 2013/0135247 A1 | 5/2013 | Na et al. |
| 2013/0307776 A1 | 11/2013 | Roziere |
| 2014/0132335 A1 | 5/2014 | Rauhala et al. |
| 2015/0035792 A1 | 2/2015 | Roziere et al. |

FOREIGN PATENT DOCUMENTS

| | | |
|---|---|---|
| FR | 2 756 048 | 5/1998 |
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

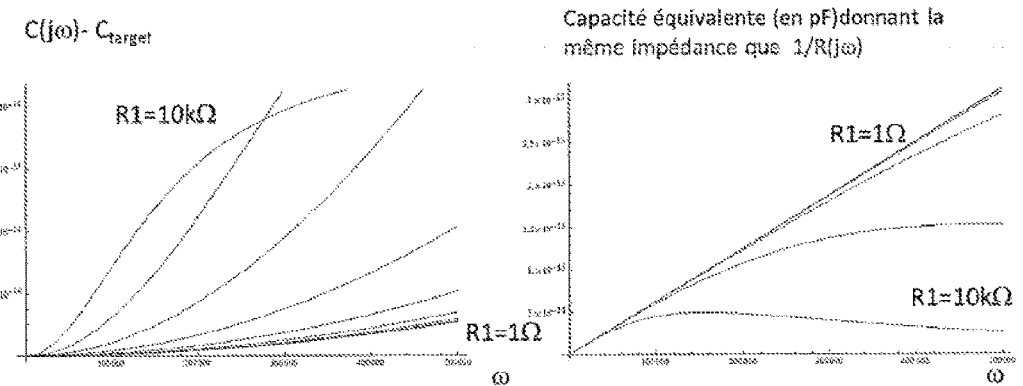
FIGURE 4
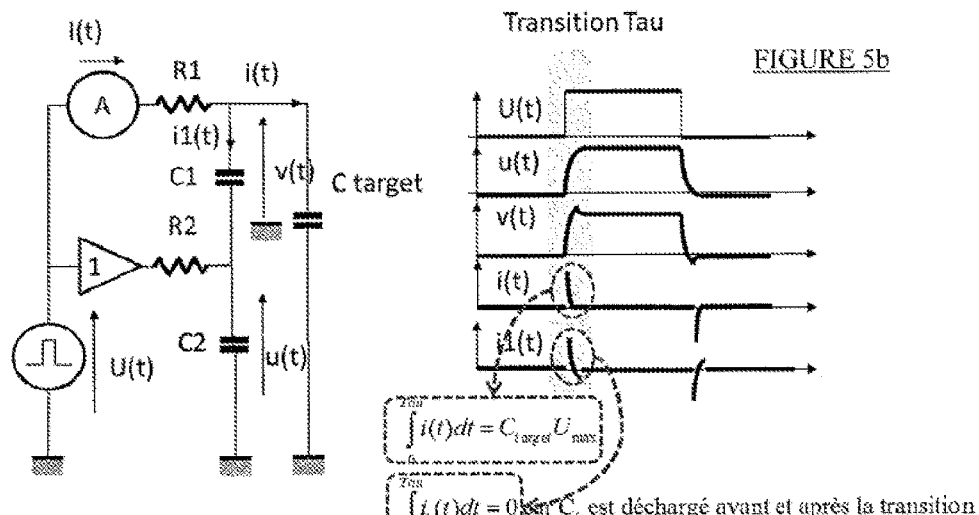
FIGURE 5a
FIGURE 5b

METHOD OF CAPACITIVE MEASUREMENT BETWEEN AN OBJECT AND AN ELECTRODE PLANE BY PARTIAL SYNCHRONOUS DEMODULATION

BACKGROUND

The present invention relates to a method of capacitive measurement between an object and an electrode plane. It finds its application in particular in the general field of 2D capacitive touch surfaces and 3D capacitive detection used for human-machine interface commands.

Increasingly, devices used for communication and for work use a touch command interface such as a pad or a screen. There can be mentioned for example mobile phones, smartphones, electronic notebooks, PC, mice, touch screens, widescreens, etc.

A large number of these interfaces use capacitive technologies. The touch surface is equipped with conductive electrodes linked to electronic means making it possible to measure the value of the capacitances created between electrodes and the object to be detected in order to perform a command.

The current capacitive techniques most frequently use two layers of conductive electrodes in the form of rows and columns. The electronics measure the coupling capacitances existing between these rows and columns. When a finger is very close to the active surface, the coupling capacitances close to the finger are altered and the electronics can thus locate the 2D position (XY) in the plane of the active surface.

This technology makes it possible to detect the presence and the position of the finger through a dielectric. This technique has the advantage of obtaining a very high resolution on the location in the plane XY of the sensitive surface of one or more fingers. These techniques nevertheless have the drawback of only detecting a contact with the object or a detection in very close proximity but not exceeding a few mm. It is difficult to perform touch commands with thick gloves (ski gloves, motorcycle gloves, etc.), with long fingernails or with a stylus. The low sensitivity of the capacitive electrodes does not allow a command to be initiated through a thick dielectric.

There are also more recent techniques allowing measurement of the absolute capacitance created between the electrodes and the object to be detected. This technique is similar to the techniques known as self-capacitance. There can be mentioned for example the patent FR2756048: Floating capacitive measuring bridge, patent FR2893711: Device and Method of Capacitive Measurement by a Floating Bridge or patent FR2844349: Proximity Detector Comprising Capacitive Sensor. These techniques make it possible to obtain a very high resolution measurement of the inter electrode-object capacitance and to detect for example a finger at a distance of several cm or even at a distance of 10 cm. The spatial detection takes place in 3 dimensions XYZ but also by touch within the plane XY. This time it is possible to initiate a command with a glove or through any type of thick dielectric.

These recent techniques involve placing a uniform conductive plane behind the measuring electrodes, brought to the excitation potential of the electrodes facing the system ground, optionally optically transparent, which eliminates the parasitic capacitive couplings between the system ground and the electrodes.

The conventional capacitive measurement techniques use a carrier frequency, preferably having a sinusoidal form, and a synchronous demodulation system for measuring the capacitance. When the nature of the sensor is purely capacitive, the measured signal corresponding to the inter electrode-object capacitance is in phase with the carrier. In practice, the nature of the touch surface is slightly resistive due to the resistivity of the material used, for example ITO for the transparent touch surfaces. This resistive nature of the sensor creates a phase offset which is seen by the electronics as a resistive leakage (in quadrature with the carrier) and which can create a significant error in the measurement. At the output of the system of measurement by synchronous demodulation, a quadrature error signal occurs that is proportional to the resistive leakage of the sensor. This signal results in degradation of the measurement of the inter electrode-object capacitance.

The aim of the present invention is to overcome the drawbacks of the prior art by proposing a novel method of avoiding this quadrature error.

SUMMARY

The above-mentioned objective is achieved with a method of capacitive measurement between an object and an electrode plane, in which method a processor unit is used for:
  applying an excitation signal to the resistive electrode plane, and
  determining a capacitance value based on a measurement from a measurement signal originating from the electrode plane.

The invention is applied advantageously to electrodes designed using a resistive material. By way of example, the electrodes and the conductive plane are designed using tin-doped indium oxide (ITO). Other materials that are transparent to light such as aluminium-doped zinc oxide (AZO) or tin-doped cadmium oxide can also be used.

According to the invention, the excitation signal is a non-sinusoidal signal comprising at least one discontinuity. In order to determine the capacitance value, the measurement signal is attenuated within a time-lapse window, this time-lapse window being the time period during which the resistivity of the electrode plane is reflected on the measurement signal in response to said at least one discontinuity. By discontinuity, is meant for example non-limitatively an edge having a duration less than one tenth of the period of the signal. A discontinuity can also be defined as any excitation signal element causing a component in phase guadrature with respect to the excitation signal.

With the method according to the invention, excitation means such as a signal generator, generate a non-sinusoidal waveform, then the interference area is identified in the measurement signal and this interference is attenuated during determination of the capacitance. In other words, a signal is applied that is capable of de-correlating the resistive effects from the capacitive effects on the measurement signal; this interference generating a component in phase quadrature with the excitation signal and therefore the useful signal. Thus, it is then possible to avoid the influences of the effects of resistivity of the electrodes on the capacitive measurement.

When the quadrature component is attenuated, there remains the in-phase component which allows the capacitance value to be determined by carrying out synchronous demodulation. Preferably, the measurement signal is suppressed within said time-lapse window. The term then used is partial demodulation as only a part of the measurement signal is demodulated.

According to an advantageous feature of the invention, the excitation signal is a square or rectangular signal. With such a signal, the present invention proposes a method of avoiding the quadrature signal. In fact, when the source is a square signal this quadrature is shown by a peak at each wavefront of the carrier. In order to avoid this parasitic peak, a partial demodulation of the measurement signal is therefore carried out, i.e. by allowing the peak to "pass" before demodulating the signal.

According to another advantageous feature of the invention, the excitation signal is also applied to a conductive plane used as an active guard plane against capacitive leakages.

Generally, an active guard plane also has a certain resistivity if it is designed using indium-doped tin oxide (ITO) or other non-metallic conductive material. It is easily demonstrated that the coupling of such a guard plane brought to the excitation potential with the system ground causes a voltage drop the value of which is a function of the position (x, y) in the guard plane. Thus this voltage drop is coupled directly with the electrodes facing the plane, in a diverse manner according to the position of the electrode in the plane. In the event of sinusoidal excitation, this is added to the quadrature component of the measurement. To the extent that the majority of coupled voltages in the guard plane also only occur at the moment the discontinuous transition of the excitation signal is applied, partial demodulation of the measurement signal thus allows this interference to be cancelled.

According to another aspect of the invention, an electronic device is proposed comprising:
- a display screen associated with a capacitive detection device, this capacitive detection device comprising an electrode plane,
- a processor unit for detecting the position of an object with respect to the display screen by measuring the capacitance between said object and the electrode plane. According to the invention, the processor unit is configured to carry out the steps described above.

A synchronous demodulator can be used to determine the capacitance value.

BRIEF DESCRIPTION OF THE DRAWINGS

Other advantages and characteristics of the invention will become apparent on examination of the detailed description of an embodiment which is in no way limitative, and the attached diagrams, in which:

FIG. 4 shows two graphs illustrating the capacitance error due to the equivalent resistances in the electrodes;

FIGS. 5a and 5b show respectively the equivalent circuit diagram of FIG. 3 with a discontinuous voltage supply, and a graph illustrating the curves of the different currents and voltages in this equivalent circuit diagram;

DETAILED DESCRIPTION

Figure 1A:
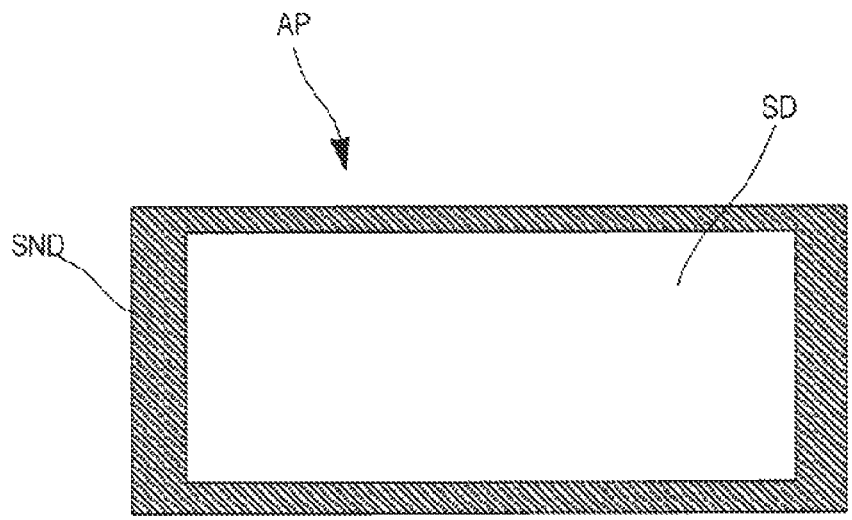
FIGS. 1a and 1b are diagrammatic views of a device according to the invention.
Figure 1B:
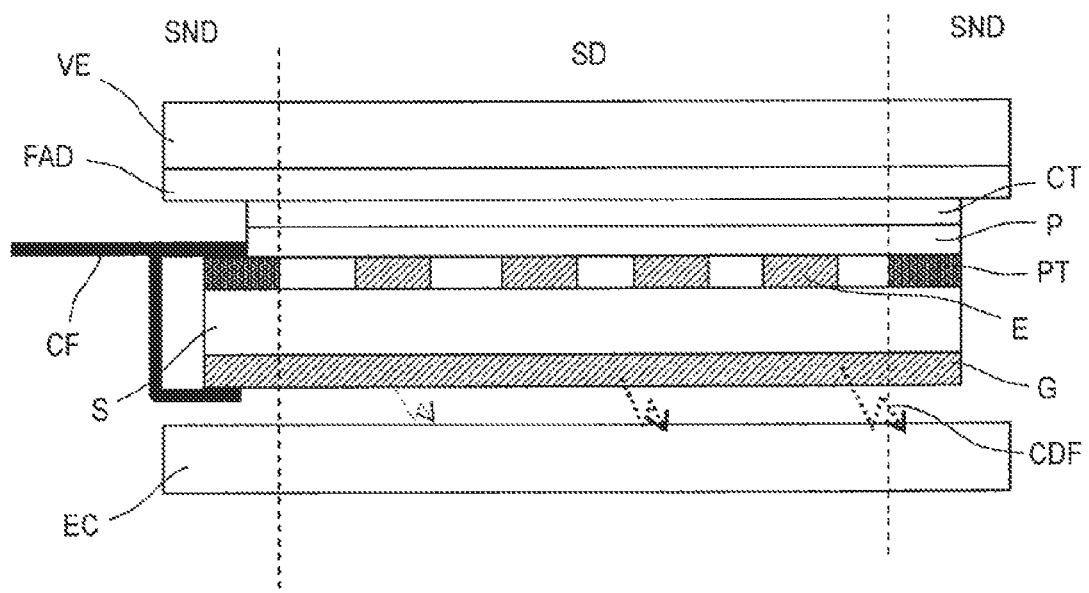

In general terms, FIGS. 1a and 1b show a device AP according to the invention. This can be a phone of the "smartphone" type or a digital tablet equipped with a touch screen. This device AP comprises a detection surface SD which is the touch part under which is located in particular a (flat or curved) electrode plane. This detection surface SD comprises, starting from the upper portion, several layers made from a transparent material such as for example:
- an outer glass VE,
- an anti-debris film FAD,
- a transparent bond CT, and
- polariser P,
- electrodes E made from conductive transparent material such as tin-doped indium oxide (ITO),
- a glass support S for electrodes,
- a guard G which is a layer made from conductive transparent material such as tin-doped indium oxide (ITO),
- a display screen EC which must be visible from the outside from the outer glass VE.

The electrodes and the guard are therefore located under the detection surface and are made from conductive transparent material which has a high resistivity.

A non-detection surface SND is also distinguished which in the case in point surrounds the detection surface SD. This surface is generally opaque from the outside and does not comprise electrodes but connecting traces PT and flexible links CF which are made from metal, therefore having almost no resistivity.

The high resistivity of the conductive transparent material can be problematic (in the presence or not of the guard G) because a coupling between this resistive material and the screen which is generally grounded to the device can take place. The electrodes (and the guard) must be substantially at one and the same potential (different to that of the screen) over the entire plane (electrodes plane and/or guard plane). When the coupling exists with the screen, leakage currents CDF exist and become more and more intense as they become more distant from the metal connections (PT, CF). Thus the coupling between the conductive transparent material (electrodes and/or guard) and the screen becomes very much greater than the coupling that it is sought to measure between the electrodes and the object of interest, assumed to be above the outer glass.

Figure 2:
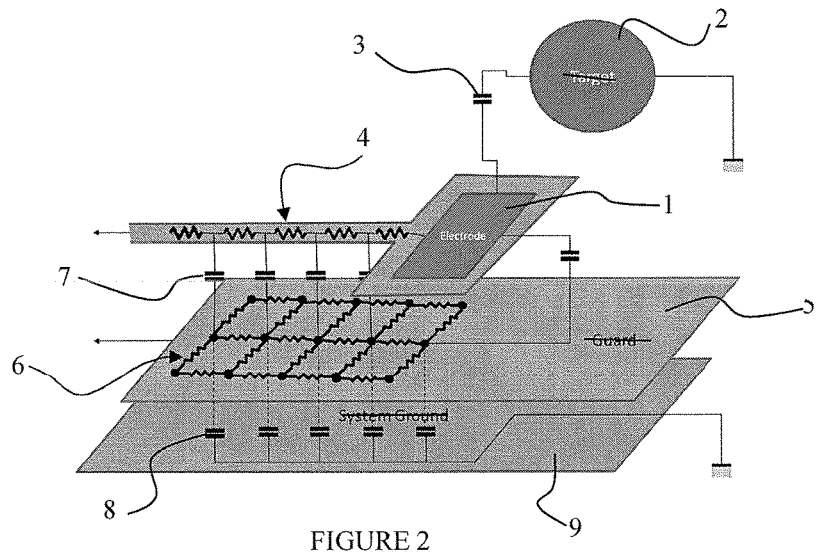
FIG. 2 is a diagrammatic view showing capacitive charge leakages due to the resistive character of the electrodes and of the guard.

FIG. 2 shows a diagram illustrating the leakage capacitances. The electrode plane 1 can be distinguished, for detecting the positioning of an object 2 by measuring the capacitance 3 (Ctarget) between them. It is assumed that the object 2 is grounded. The electrodes are designed based on ITO which has a high resistivity. This latter is represented by a series of resistors 4.

The guard plane 5 is also resistive because it contains ITO. This resistivity is represented by an array of resistors 6. Charge leakages 7 exist between the resistors 4 and the resistors 6. Moreover, leakage capacitances 8 also exist between the resistors 6 and a ground plane 9 (generally the display screen of the device).

Figures 3A, 3B, 3C:
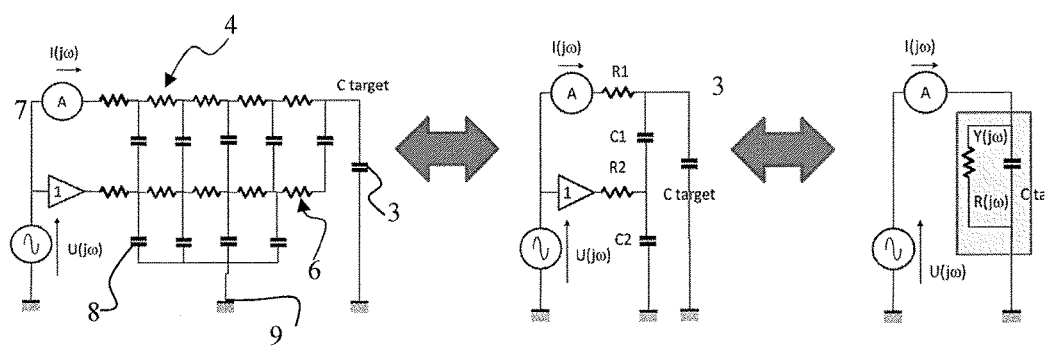
FIGS. 3a, 3b and 3c are equivalent electronic circuit diagrams of the electrodes and of the guard.

FIG. 3a shows an equivalent simplified electronic circuit diagram of the capacitance 3 between the object and the electrodes, the resistors 4, the leakage capacitances 7, the resistors 6, and the leakage capacitances 8. A voltage source $U(j\omega)$ can also be seen, for supplying the resistors 4 via a current $I(j\omega)$. FIG. 3b is an equivalent diagram of the diagram in FIG. 3a. The resistors 4 are equivalent to a single resistor R1 in parallel with the capacitor 3 and of a spur comprising a capacitor C1 equivalent to the capacitors 7. On this spur there can also be seen in parallel the resistor R2 equivalent to the resistors 6 supplied by the voltage $U(j\omega)$, and a capacitor C2 equivalent to the capacitors 8 then connected to ground.

FIG. 3c also shows in a more simplified manner an equivalent circuit diagram where the resistors and the capacitors are represented by a admittance $Y(j\omega)$.

Starting from $Y(j\omega)$, the equivalent capacitance $C(j\omega)$ is given by:

$$C(j\omega) = \frac{(C_{target} + (C_2 C_{target} + C_1(C_2 + C_{target})) R_2(C_2 R_2 + C_1(R_1 + R_2))\omega^2)}{1 + ((C_1 + C_{target})^2 R_1^2 + 2C_1^2 R_1 R_2 + (C_1 + C_2)^2 R_2^2)\omega^2 + (C_2 C_{target} + C_1(C_2 + C_{target}))^2 R_1^2 R_2^2 \omega^4}$$

$$C(j\omega) \approx C_{target} + \frac{C_1 C_2 R_2(C_2 R_2 + C_1 R_1 + C_1 R_2)\omega^2)}{1 + C_1^2 R_1^2 + 2C_1^2 R_1 R_2 + (C_1 + C_2)^2 R_2^2)\omega^2 + C_1^2 C_2^2 R_1^2 R_2^2 \omega^4}$$

Starting from $Y(j\omega)$, the equivalent resistance $R(j\omega)$ is given by:

$$\frac{1}{R(j\omega)} = \frac{\omega^2(C_1 C_{target} R_1 + C_{target}^2 R_1 - C_1 C_2 R_2 + (C_2 C_{target} + C_1(C_2 + C_x))^2 R_1 R_2^2 \omega^2)}{1 + ((C_1 + C_{target})^2 R_1^2 + 2C_1^2 R_1 R_2 + (C_1 + C_2)^2 R_2^2)\omega^2 + (C_2 C_{target} + C_1(C_2 + C_{target}))^2 R_1^2 R_2^2 \omega^4}$$

In FIG. 4, the capacitance errors can be seen as a function of the frequency.

FIG. 5a shows the equivalent diagram of FIG. 3 but with a discontinuous voltage supply. This is a pulse voltage U(t). In FIG. 5b it can be seen that the signals (current and voltage) at the terminals of capacitors 3, C1 and C2, comprise a deformation at the moment of the transition: rising edge and falling edge. A time lapse or period tau ($\tau$) can be defined in which this deformation is located.

Figure 6:
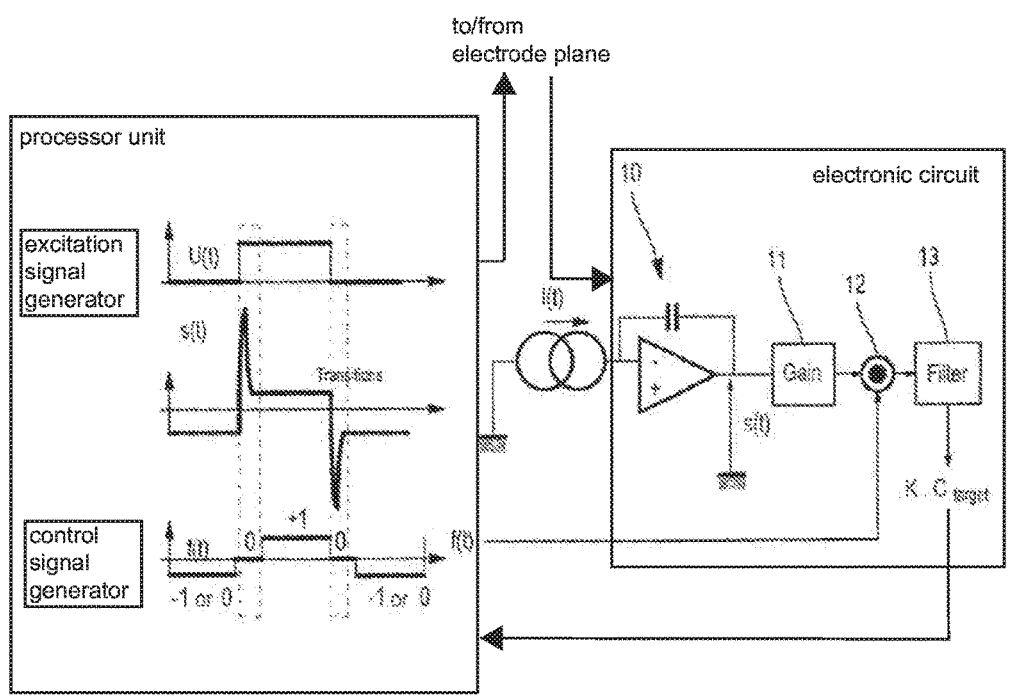
FIG. 6 is a view of an equivalent electronic circuit diagram for the implementation of the method according to the invention.

The diagram of FIG. 6 allows the effects of this discontinuity to be disregarded. To this end, the current I(t) supplying the equivalent resistor R1 is measured. For the measurement, this current is replicated at the input of an integrator 10 which gives at its output s(t), the curve of which is shown on the left-hand side of the figure. The presence of peaks during the rising edge and the falling edge of the excitation signal can be seen. In order to eliminate these peaks, the measurement will be taken, i.e. synchronous modulation will be carried out, only during the time period when these peaks do not exist. In fact, the window in which the measurement signal is taken into account is optimized: only the useful signal is retained. To this end, using a signal generator (not shown), a signal f(t) is generated which varies between 1 and O (and/or −1) which allows the measurement signal s(t) to pass or cancels it. For the synchronous demodulation, a gain amplifier 11, a demodulator 12 and a filter 13 are used. The signal f(t) is introduced either at the level of the demodulator or at the level of the gain 11. The output of the filter gives a value proportional to the capacitor 3: $K.C_{target}$.

Tau can be modulated in order to reduce or completely eliminate the quadrature error.

Of course, the invention is not limited to the examples which have just been described and numerous adjustments can be made to these examples without exceeding the scope of the invention.

The invention claimed is:

1. A method of capacitive measurement between an object and an electrode plane, in which method a processor unit operates as follows:
    applying an excitation signal to the electrode plane;
    generating a control signal for a mixing circuit, the control signal defining a measurement window and a time-lapse window for the mixing circuit; and
    determining a capacitance value representative of a capacitance between the object and an electrode in the electrode plane based on a measurement from a measurement signal originating from the electrode plane,
    wherein the excitation signal is a non-sinusoidal signal comprising at least one discontinuity, and in order to determine the capacitance value, the measurement signal is evaluated during the measurement window and not evaluated during the time-lapse window, the time-lapse window being a time period during which said at least one discontinuity is occurring, and the measurement window being a time period free of said at least one discontinuity.

2. The method according to claim 1, characterized in that the excitation signal is a square or rectangular signal.

3. The method according to claim 1, characterized in that the measurement is carried out by synchronous demodulation at the mixing circuit.

4. The method according to claim 1, characterized in that the measurement signal is suppressed within said time-lapse window.

5. The method according to claim 1, characterized in that the excitation signal is at substantially the same potential as a guard signal applied on a conductive plane used as an active guard plane against capacitive leakages.

6. An electronic device comprising:
    a display screen associated with a capacitive detection device, the capacitive detection device comprising an electrode plane; and
    a processor unit electrically couplable to the electrode plane for detecting the position of an object with respect to the display screen by measuring the capacitance between said object and the electrode plane, the processor unit capable of
        applying an excitation signal to the electrode plane, the excitation signal being a non sinusoidal signal comprising at least one discontinuity,
        generating a control signal for a mixing circuit, the control signal defining a measurement window and a time-lapse window for the mixing circuit, and
        determining a capacitance value representative of a capacitance between the object and an electrode in the electrode plane based on a measurement from a measurement signal originating from the electrode plane, the measurement signal evaluated during the measurement window and not evaluated within the time-lapse window, this time-lapse window being a time period during which said at least one discontinuity is occurring, and the measurement window being a time period free of said at least one discontinuity.

7. The device according to claim 6, further comprising an electronic circuit electrically coupled to the processor unit and electrically couplable to the electrode plane, the electronic circuit including the mixing circuit configured as a synchronous demodulator for determining the capacitance value.

8. The device according to claim 6, the capacitive detection device further comprising a conductive plane used as an active guard plane against capacitive leakages, the excitation signal being substantially the same potential as a guard signal applied to this conductive plane.

9. The device according to claim 8, characterized in that the conductive plane is designed using tin-doped indium oxide.

10. The device according to claim 6, characterized in that the electrodes are designed using tin-doped indium oxide.

11. An electronic device, comprising:
a processor unit for detecting a position of an object with respect to a capacitive detection device including an electrode plane by measuring a capacitance between the object and one or more electrodes in the electrode plane, the processor unit electrically couplable to the electrode plane and capable of applying an excitation signal to the electrode plane; the excitation signal being a non sinusoidal signal comprising at least one discontinuity, the processor unit further capable of generating a control signal for a mixing circuit, the control signal defining a measurement window and a time-lapse window for the mixing circuit; and
an electronic circuit electrically coupled to the processor unit and including the mixing circuit, the electronic circuit electrically couplable to the electrode plane and configured for
receiving a measurement signal from the one or more electrodes,
evaluating the measurement signal during the measurement window and not evaluating the measurement signal during the time-lapse window, the time-lapse window being a time period during which the at least one discontinuity is occurring, and the measurement window being a time period free of the at least one discontinuity;
wherein the processor unit is further capable of determining a capacitance value representative of a capacitance between the object and an electrode in the electrode plane based on the evaluated measurement signal.

12. The electronic device of claim 11, wherein the excitation signal is a square or rectangular signal.

13. The electronic device of claim 11, wherein the mixing circuit is configured as a synchronous demodulator for evaluating the measurement signal.

14. The electronic device of claim 13, wherein the synchronous demodulator is configured for demodulating the measurement signal only during the measurement window.

15. The electronic device of claim 11, the electronic circuit further configured for suppressing the measurement signal within the time-lapse window.

16. The electronic device of claim 11, wherein the electronic circuit is configured for receiving a filtering signal for identifying the measurement window and the time-lapse window.

17. The electronic device of claim 11, the capacitive detection device further comprising a conductive plane used as an active guard plane against capacitive leakages, the active guard plane receiving a guard signal referenced to the excitation signal.

* * * * *